(12) United States Patent
Iyasu et al.

(10) Patent No.: US 10,075,059 B2
(45) Date of Patent: Sep. 11, 2018

(54) CURRENT DETECTION APPARATUS AND POWER CONVERSION APPARATUS

(71) Applicant: DENSO CORPORATION, Kariya, Aichi-pref. (JP)

(72) Inventors: Seiji Iyasu, Nishio (JP); Yuji Hayashi, Nishio (JP); Kimikazu Nakamura, Kariya (JP); Yuichi Handa, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/816,555

(22) Filed: Nov. 17, 2017

(65) Prior Publication Data

US 2018/0138803 A1    May 17, 2018

(30) Foreign Application Priority Data

Nov. 17, 2016  (JP) .................. 2016-224453

(51) Int. Cl.
*G01R 19/22* (2006.01)
*H02M 3/335* (2006.01)
*H02M 1/088* (2006.01)
*H02M 1/00* (2006.01)

(52) U.S. Cl.
CPC ........... *H02M 1/088* (2013.01); *G01R 19/22* (2013.01); *H02M 3/33592* (2013.01); *H02M 2001/0009* (2013.01)

(58) Field of Classification Search
CPC ............. H02M 3/335; H02M 3/33569; H02M 3/33567; H02M 2001/0009; G01R 19/22
See application file for complete search history.

(56) References Cited

U.S. PATENT DOCUMENTS

| 2015/0109838 A1* | 4/2015 | Chen .................. H02M 1/08 363/126 |
| 2015/0124489 A1* | 5/2015 | Dai .................... H02M 3/335 363/17 |
| 2015/0311788 A1* | 10/2015 | Nandi ................ H02M 1/4225 323/282 |
| 2015/0381061 A1* | 12/2015 | Yan ................... H02M 3/33546 363/21.02 |
| 2016/0301320 A1* | 10/2016 | Wakabayashi .... H02M 3/33569 |

FOREIGN PATENT DOCUMENTS

JP     2007-325340 A     12/2007

* cited by examiner

*Primary Examiner* — Timothy J Dole
*Assistant Examiner* — Ishrat Jamali
(74) *Attorney, Agent, or Firm* — Oliff PLC

(57) ABSTRACT

A current detection apparatus is provided which detects a current flowing through a detection part in an electrical circuit. The current detection apparatus includes a first coil connected in series with the detection part, a second coil magnetically coupled with the first coil, a full-wave rectifier circuit connected to both ends of the second coil, a switching element having a first end connected to a positive electrode side output part of the full-wave rectifier circuit and a second end connected to a first resistor, and a second resistor that forms a closed circuit with the second coil regardless of an open or closed state of the switching element.

11 Claims, 14 Drawing Sheets

CURRENT DETECTION APPARATUS AND POWER CONVERSION APPARATUS

CROSS-REFERENCE TO RELATED APPLICATION

This application is based on and claims the benefit of priority from earlier Japanese Patent Application No. 2016-224453 filed Nov. 17, 2016, the description of which is incorporated herein by reference.

BACKGROUND

Technical Field

The present invention relates to a current detection apparatus and a power conversion apparatus including the current detection apparatus.

Related Art

Conventionally, there is a current detection apparatus which, in order to detect a current flowing through an electrical circuit, supplies a current from a first coil connected in series with a detection part in the electrical circuit to a second coil magnetically coupled with the first coil and detects a value of the current on the second coil side.

Examples of such a current detection apparatus include the current detection apparatus disclosed in JP-A-2007-325340. In the current detection apparatus disclosed in JP-A-2007-325340, a pair of switching elements is provided to enable detection of a bidirectional current flowing through a detection part in an electrical circuit.

In the current detection apparatus disclosed in JP-A-2007-325340, since the pair of switching elements is provided to detect a bidirectional current, problems occur such as increase in manufacturing cost of the apparatus and increase in size of the apparatus. Furthermore, the switching elements are P-type metal-oxide-semiconductor field-effect transistors (MOSFETs) and thus, a negative polarity power supply for driving the switching elements is necessary.

SUMMARY

An embodiment provides a current detection apparatus that allows reduction in cost of the whole apparatus.

As an aspect of the embodiment, a current detection apparatus is provided which detects a current flowing through a detection part in an electrical circuit. The current detection apparatus includes: a first coil connected in series with the detection part; a second coil magnetically coupled with the first coil; a full-wave rectifier circuit connected to both ends of the second coil; a switching element having a first end connected to a positive electrode side output part of the full-wave rectifier circuit and a second end connected to a first resistor; and a second resistor that forms a closed circuit with the second coil regardless of an open or closed state of the switching element.

DETAILED DESCRIPTION OF THE PREFERRED EMBODIMENTS

Figure 1:
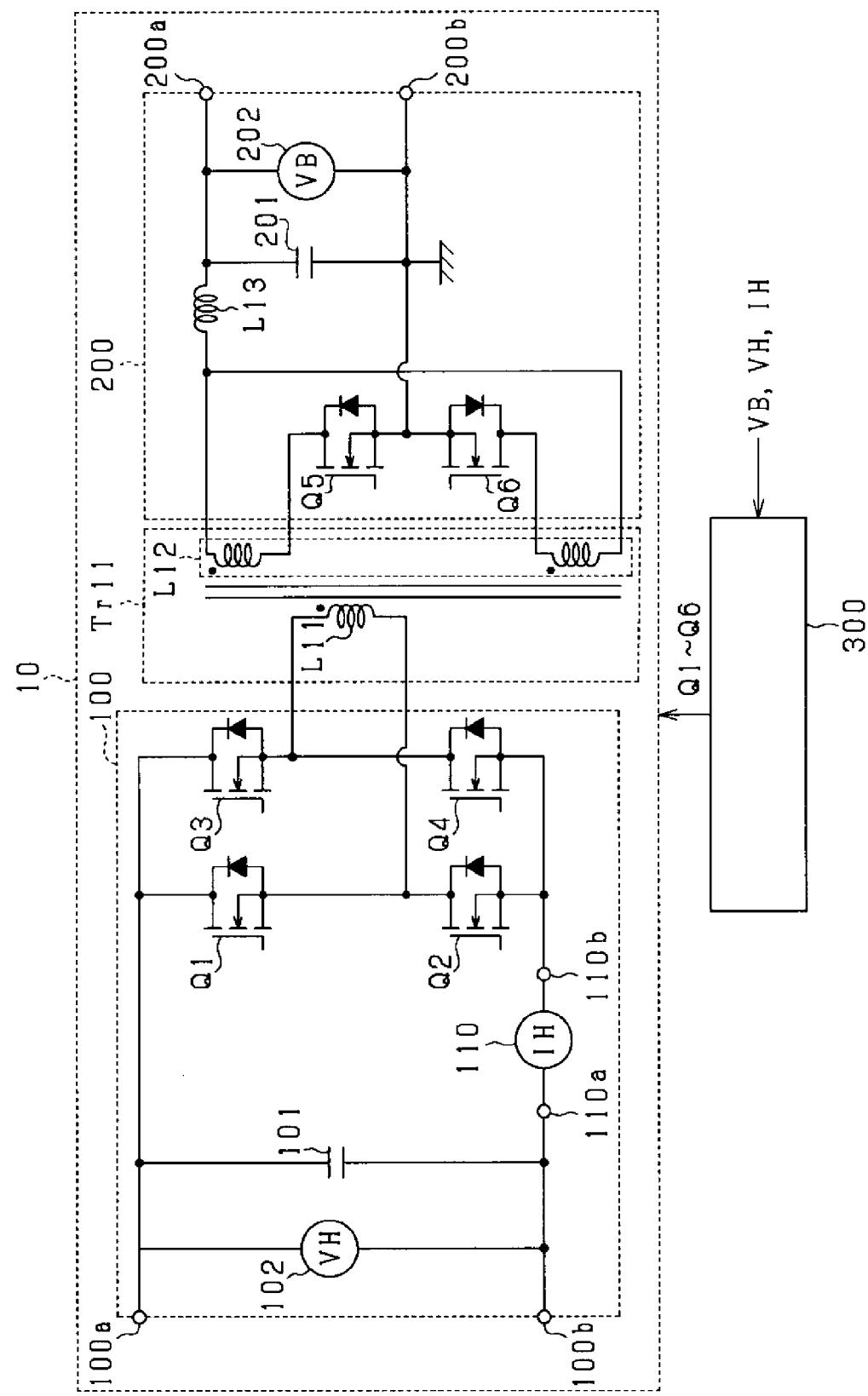
FIG. 1 is a circuit diagram of a power conversion apparatus.

Embodiments will be described below with reference to the drawings. Note that the same or equivalent parts throughout the following embodiments share the same reference signs in the drawings, and the same description applies to the parts denoted by the same reference signs.

First Embodiment

FIG. 1 is a circuit diagram of a power converter (power conversion apparatus) 10 according to the present embodiment. The power converter 10 includes a first circuit 100 and a second circuit 200 electrically connected via a transformer Tr11, and a control unit 300 that controls the first circuit 100 and the second circuit 200.

The transformer Tr11 includes a high-voltage side coil L11 and a low-voltage side coil L12 magnetically coupled with each other, and the low-voltage side coil L12 has a center tap. The number of turns of the high-voltage side coil L11 is N/2 times the number of turns of the low-voltage side coil L12. That is, the number of turns of the high-voltage side coil L11 is N times the number of turns from one of the ends of the low-voltage side coil L12 up to the center tap.

The first circuit 100 connected to the high-voltage side coil L11 includes first to fourth switching elements Q1 to Q4. In the present embodiment, N-type MOSFETs are used as the first to fourth switching elements Q1 to Q4. One of the ends of the high-voltage side coil L11 is connected to the source of the first switching element Q1 and the drain of the second switching element Q2. The other of the ends of the high-voltage side coil L11 is connected to the source of the third switching element Q3 and the drain of the fourth switching element Q4. The drain of the first switching element Q1 and the drain of the third switching element Q3 are connected to a positive electrode side terminal 100a, and the source of the second switching element Q2 and the source of the fourth switching element Q4 are connected to a negative electrode side terminal 100b. A capacitor 101 is connected in parallel with the positive electrode side terminal 100a and the negative electrode side terminal 100b. A secondary battery such as a lithium ion battery is, for example, connected to the positive electrode side terminal 100a and the negative electrode side terminal 100b. The first circuit 100 is configured as described above and thus can be said as a voltage conversion circuit that steps down the voltage by controlling a switching element group.

The second circuit 200 connected to the low-voltage side coil L12 includes a fifth switching element Q5, a sixth switching element Q6, and a choke coil L13. In the present embodiment, N-type MOSFETs are used as the fifth and sixth switching elements Q5 and Q6. Both ends of the low-voltage side coil L12 are connected to the drain of the fifth switching element Q5 and the drain of the sixth switching element Q6, respectively. Meanwhile, the source of the fifth switching element Q5 and the source of the sixth switching element Q6 are connected to each other. The center tap of the low-voltage side coil L12 is connected to a positive electrode side terminal 200a via the choke coil L13, and the connection point between the fifth switching element Q5 and the sixth switching element Q6 is connected to a negative electrode side terminal 200b. A capacitor 201 is connected in parallel with the positive electrode side terminal 200a and the negative electrode side terminal 200b. A secondary battery such as a lead storage battery is, for example, connected to the positive electrode side terminal 200a and the negative electrode side terminal 200b. The second circuit 200 is configured as described above and can be said as a current conversion circuit that increases the current of the choke coil L13 by controlling the fifth and sixth switching elements Q5 and Q6.

The power converter 10 includes a first voltage detection unit 102 which detects a first voltage VH that is a voltage between the positive electrode side terminal 100a and the negative electrode side terminal 100b of the first circuit 100, a second voltage detection unit 202 which detects a second voltage VB that is a voltage between the positive electrode side terminal 200a and the negative electrode side terminal 200b of the second circuit 200, and a current detection unit (current detection apparatus) 110 which detects a current value IH that is a current flowing between current detection parts 110a and 110b between the capacitor 101 and the switching element group of the first circuit 100. Note that one of the current detection parts 110a and 110b that is on the capacitor 101 side is referred to as a first end 110a, and one of the current detection parts 110a and 110b that is on the switching element group side is referred to as a second end 110b. The detected first voltage VH, second voltage VB, and current value IH are input to the control unit 300.

Figure 2:
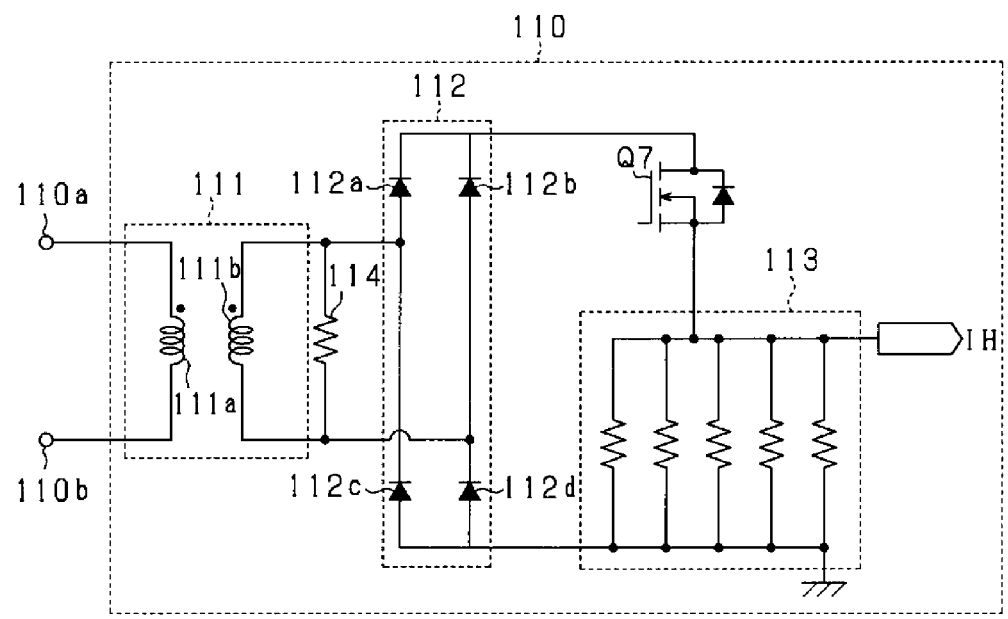
FIG. 2 is a circuit diagram of a current detection apparatus.

The configuration of the current detection unit 110 will be described with reference to FIG. 2. The current detection unit 110 includes a transformer 111 including a first coil 111a and a second coil 111b magnetically coupled with each other, a full-wave rectifier circuit 112 connected to the second coil 111b, a switching element Q7 having a first end connected to an output part on the positive electrode side of the full-wave rectifier circuit 112 and a second end connected to a terminating resistor 113, and a reset resistor 114 provided between the second coil 111b and the full-wave rectifier circuit 112 and connected in parallel with the second coil 111b and the full-wave rectifier circuit 112. As with the first to sixth switching elements Q1 to Q6, an N-type MOSFET is used as the seventh switching element Q7. Specifically, the drain of the switching element Q7 is connected to the full-wave rectifier circuit 112, and the source of the switching element Q7 is connected to the terminating resistor 113. The number of turns of the second coil 111b of the transformer 111 is set to be Nct times the number of turns of the first coil 111a (Nct is a number more than 1). Generally, a value of approximately 50 to 1000 is used as a specific value of Nct. Note that the terminating resistor 113 may be referred to as a first resistor, and the reset resistor 114 may be referred to as a second resistor.

The full-wave rectifier circuit 112 includes first to fourth diodes 112a to 112d. Specifically, the cathode of the third diode 112c is connected to the anode of the first diode 112a, the cathode of the fourth diode 112d is connected to the anode of the second diode 112b, the cathode of the first diode 112a and the cathode of the second diode 112b are connected to each other, and the anode of the third diode 112c and the anode of the fourth diode 112d are connected to each other.

The first end of the second coil 111b is connected to the connection part between the first diode 112a and the third diode 112c, and the second end of the second coil 111b is connected to the connection part between the second diode 112b and the fourth diode 112d.

The connection part between the first diode 112a and the third diode 112c, which serves as the output part on the positive electrode side of the full-wave rectifier circuit 112, is connected to the drain of the switching element Q7, and the terminating resistor 113 is connected to the source of the switching element Q7. The terminating resistor 113 includes a plurality or resistors connected in parallel.

The current detection unit 110 configured as described above detects a current flowing between the switching element Q7 and the terminating resistor 113 and determines the current value IH between the current detection parts 110a and 110b by multiplying the detected value by a turn ratio Nct.

A current flowing through a current detector when electrical power is exchanged between the first circuit 100 and the second circuit 200 in the power converter 10 configured as described above will be described with reference to FIGS. 3 to 6.

Figure 3:
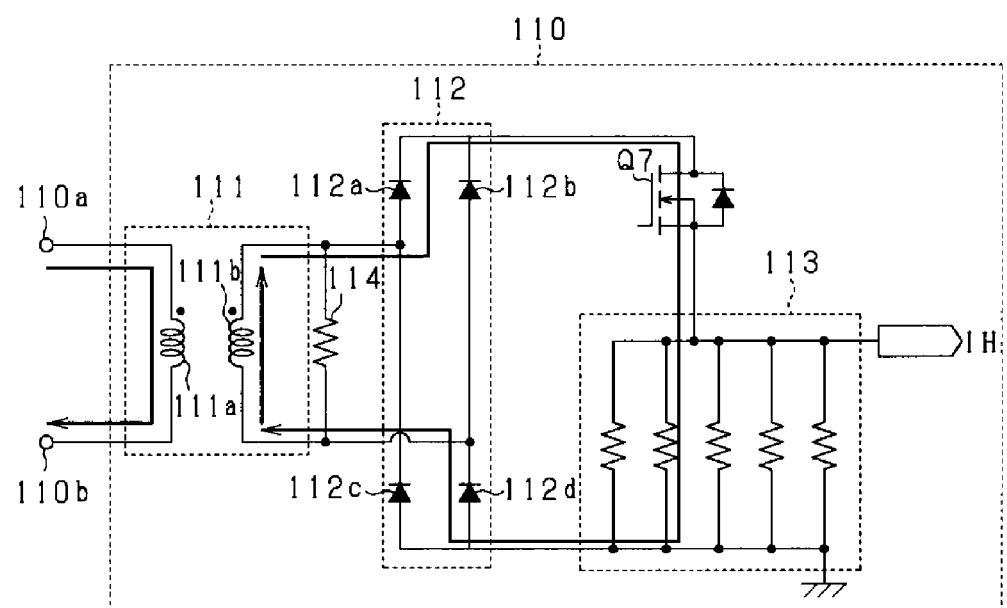
FIG. 3 is a diagram illustrating an electrical pathway when current flows through a current detection part in the forward direction.
Figure 4:
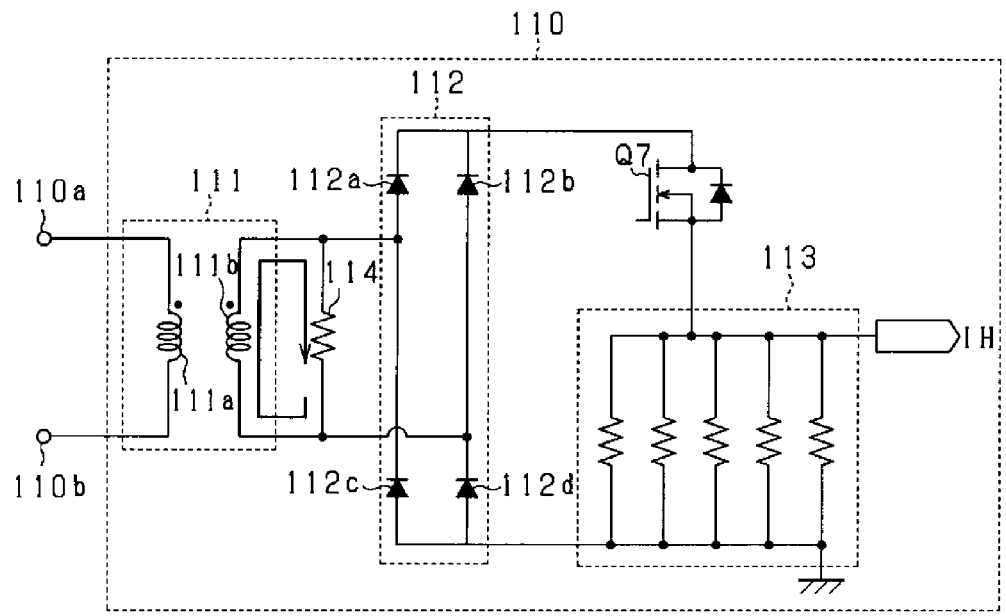
FIG. 4 is a diagram illustrating an electrical pathway when current is reset in the current detection apparatus.

As illustrated in FIG. 3, current flows from the first end 110a to the second end 110b of the current detection unit 110 when electrical power is supplied from the first circuit 100 to the second circuit 200. The switching element Q7 is turned on to detect the current of this case. As a result, as indicated by the arrows in FIG. 3, current flows from the positive electrode side of the full-wave rectifier circuit 112 toward the switching element Q7 and the terminating resistor 113, and thus the current value IH of the current flowing through the current detection parts 110a and 110b can be determined based on the current value between the switching element Q7 and the terminating resistor 113.

On the other hand, the switching element Q7 is kept in an off state during a time period in which current is not detected. This allows current to flow through a closed circuit including the second coil 111b and the reset resistor 114, as indicated by the arrow in FIG. 4, and thus the magnetic energy stored in the transformer 111 is consumed by the reset resistor 114 as heat.

Figure 5:
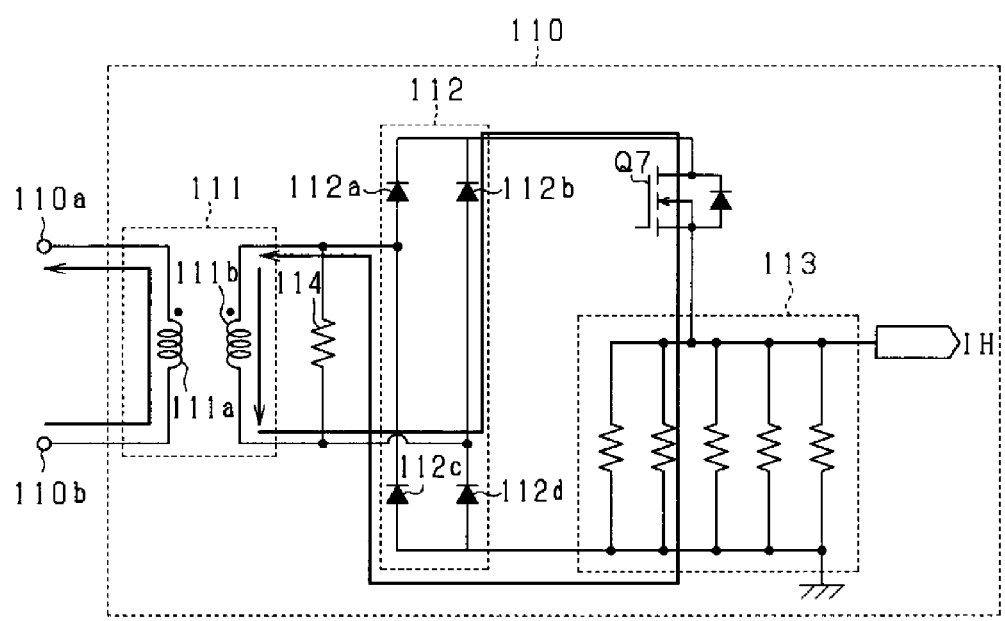
FIG. 5 is a diagram illustrating an electrical pathway when current flows through a current detection part in the reverse direction.
Figure 6:
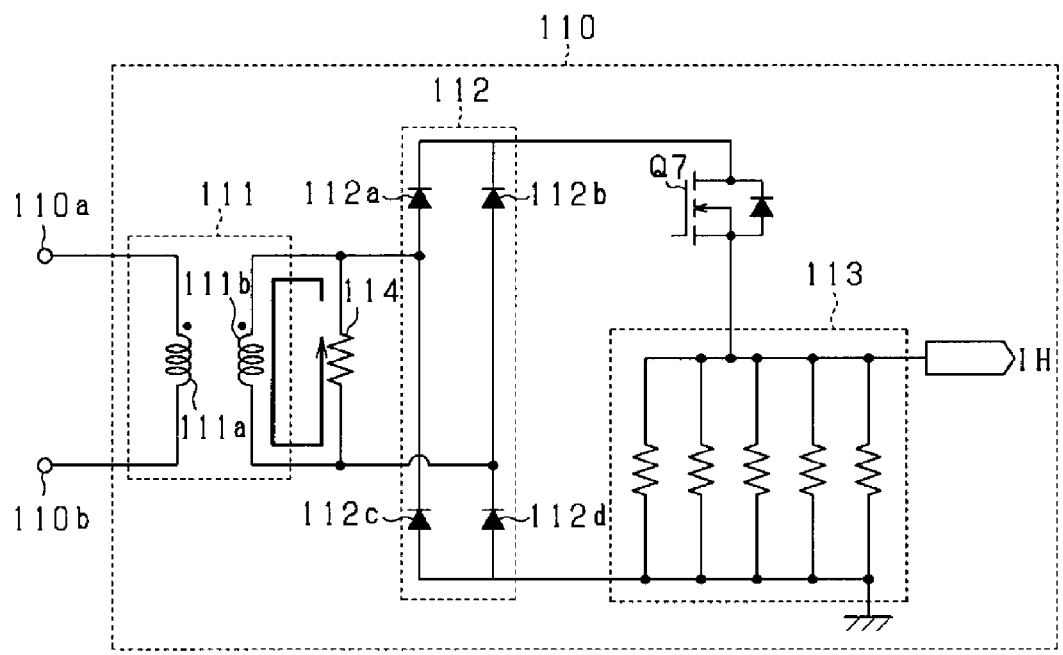
FIG. 6 is a diagram illustrating an electrical pathway when current is reset in the current detection apparatus.

As illustrated in FIG. 5, current flows from the second end 110b to the first end 110a of the current detection unit 110 when electrical power is supplied from the second circuit 200 to the first circuit 100. The switching element Q7 is turned on to detect the current in this case. As a result, as indicated by the arrows in FIG. 5, current flows from the positive electrode side of the full-wave rectifier circuit 112 toward the switching element Q7 and the terminating resistor 113, and thus the current value IH of the current flowing through the current detection parts 110a and 110b can be determined on based on the current value between the switching element Q7 and the terminating resistor 113.

On the other hand, the switching element Q7 is kept in an off state during a time period in which current is not detected. This allows current to flow through a closed circuit including the second coil 111b and the reset resistor 114, as indicated by the arrow in FIG. 6, and thus magnetic energy stored in the transformer 111 is consumed by the reset resistor 114 as heat.

Next, the control of the switching elements Q1 to Q7 for the case in which electrical power is exchanged between the first circuit 100 and the second circuit 200, and the current value IH detected by the current detection unit 110 will be described with reference to FIGS. 7 to 10.

Figure 7:
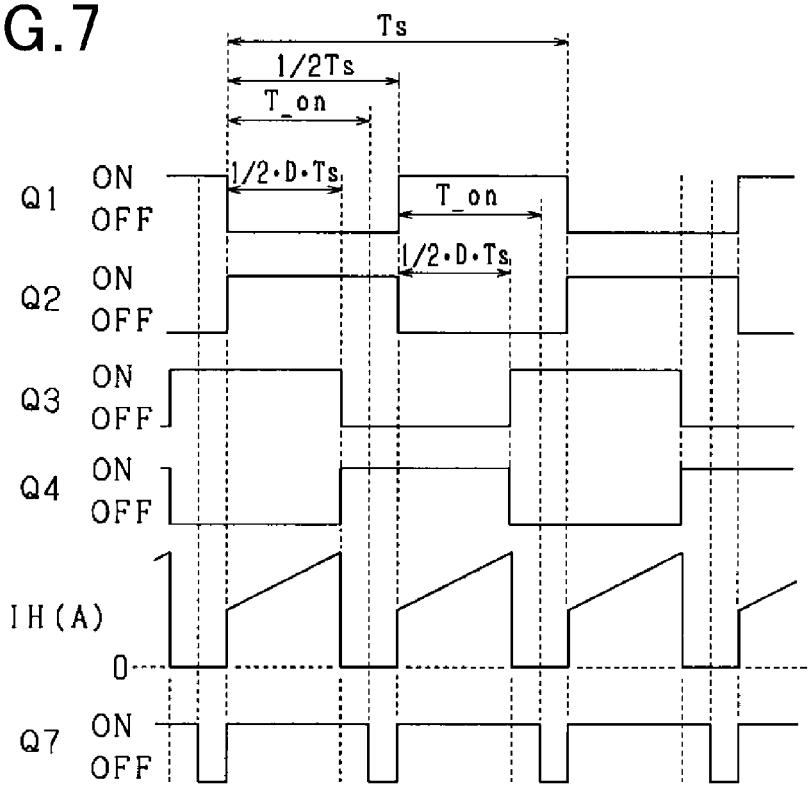
FIG. 7 is a time chart when electrical power is supplied from a first circuit to a second circuit.

First, the case in which the switching elements Q1 to Q4 of the first circuit 100 are controlled so that electrical power is supplied from the first circuit 100 to the second circuit 200 will be described with reference to FIG. 7.

In the case in which electrical power is supplied from the first circuit 100 to the second circuit 200, in the first circuit 100, the first switching element Q1 and the second switching element Q2 are controlled to be synchronized and be in different on/off states, and the third switching element Q3 and the fourth switching element Q4 are controlled to be synchronized and be in different on/off states. As a result of this control, a time period during which the first switching element Q1 and the fourth switching element Q4 are both in on states and the second switching element Q2 and the third switching element Q3 are both in off states, a time period during which the first switching element Q1 and the third switching element Q3 are both in on states and the second switching element Q2 and the fourth switching element Q4 are both in off states, a time period during which the second switching element Q2 and the third switching element Q3 are both in on states and the first switching element Q1 and the fourth switching element Q4 are both in off states, and a time period during which the second switching element Q2 and the fourth switching element Q4 are both in on states and the first switching element Q1 and the third switching element Q3 are both in off states are provided in this order.

In this case, electrical power is supplied from the first circuit 100 to the second circuit 200 in the time period during which the first switching element Q1 and the fourth switching element Q4 are both in on states and the second switching element Q2 and the third switching element Q3 are both in off states and the time period during which the second switching element Q2 and the third switching element Q3 are both in on states and the first switching element Q1 and the fourth switching element Q4 are both in off states. That is, current flows between the current detection parts 110a and 110b.

No electrical power is supplied from the first circuit 100 to the second circuit 200 in the time period during which the first switching element Q1 and the third switching element Q3 are both in on states and the second switching element Q2 and the fourth switching element Q4 are both in off states and the time period during which the second switching element Q2 and the fourth switching element Q4 are both in on states and the first switching element Q1 and the third switching element Q3 are both in off states. That is, no current flows between the current detection parts 110a and 110b.

Since the switching elements Q1 to Q4 are controlled in this way, the current detection parts 110a and 110b are applied with electricity intermittently.

In such control of the switching elements Q1 to Q4, a time period during which the current flows between the current detection parts 110a and 110b can be represented by "½·D·Ts" using a duty cycle D that is a numerical value less than 1, where Ts is one control period from the time when any of the switching elements Q1 to Q4 is turned on to the time when said any of the switching elements Q1 to Q4 is turned on again.

In the current detection unit 110, the switching element Q7 is turned on at the time included in the time period during which current flows between the current detection parts 110a and 110b. Specifically, in the case in which the third switching element Q3 is in an off state and the fourth switching element Q4 is in an on state, the switching element Q7 is turned on in synchronization with the control of turning on the first switching element Q1 in an off state and turning off the second switching element Q2 in an on state. In this case, the switching element Q7 is turned off after the state in which the first switching element Q1 is in an on state and the second switching element Q2 is an off state is continued and control is performed to turn on the third switching element Q3 in an off state and turn off the fourth switching element Q4 in an on state.

Alternatively, in the case in which the third switching element Q3 is in an on state and the fourth switching element Q4 is in an off state, the switching element Q7 is turned on in synchronization with control of turning off the first switching element Q1 in an on state and turning on the second switching element Q2 in an off state. In this case, the switching element Q7 is turned off after the state in which the first switching element Q1 is in an off state and the second switching element Q2 is in an on state continues and control is performed to turn off the third switching element Q3 in an on state and turn on the fourth switching element Q4 in an off state.

In such control, the moment of turning off the switching element Q7 may be the moment of the control of the switching elements Q1 to Q4 to end the time period of electrical conduction between the current detection parts 110a and 110b. Alternatively, in the case in which the upper limit of the time period during which current flows between the current detection parts 110a and 110b is predetermined, that is, in the case in which an upper limit value Dmax is predetermined as the upper limit of the duty cycle D, an on time period T_on of the switching element Q7 may be set to a time period longer than "½·Dmax·Ts" and shorter than Ts/2.

Figure 8:
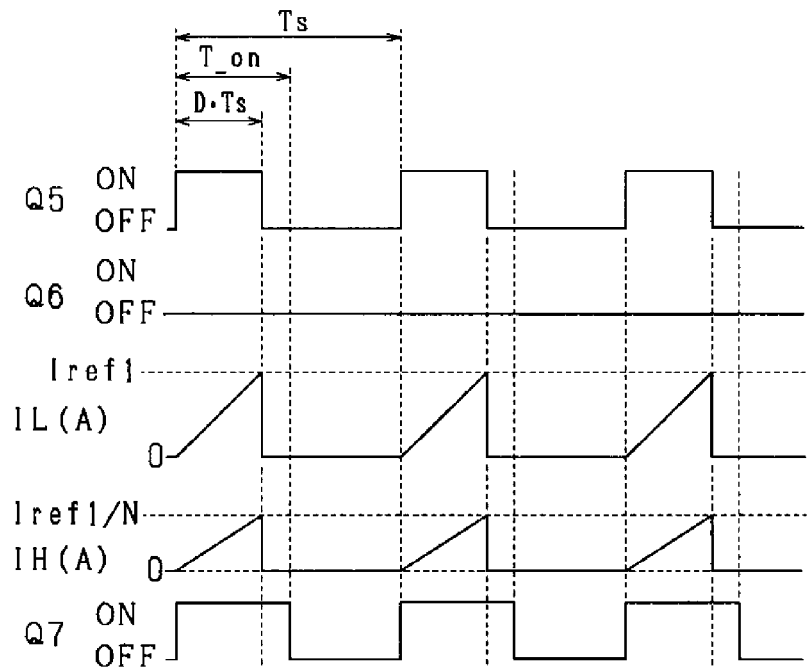
FIG. 8 is a time chart in the case in which first mode control is performed when electrical power is supplied from the second circuit to the first circuit.
Figure 9:
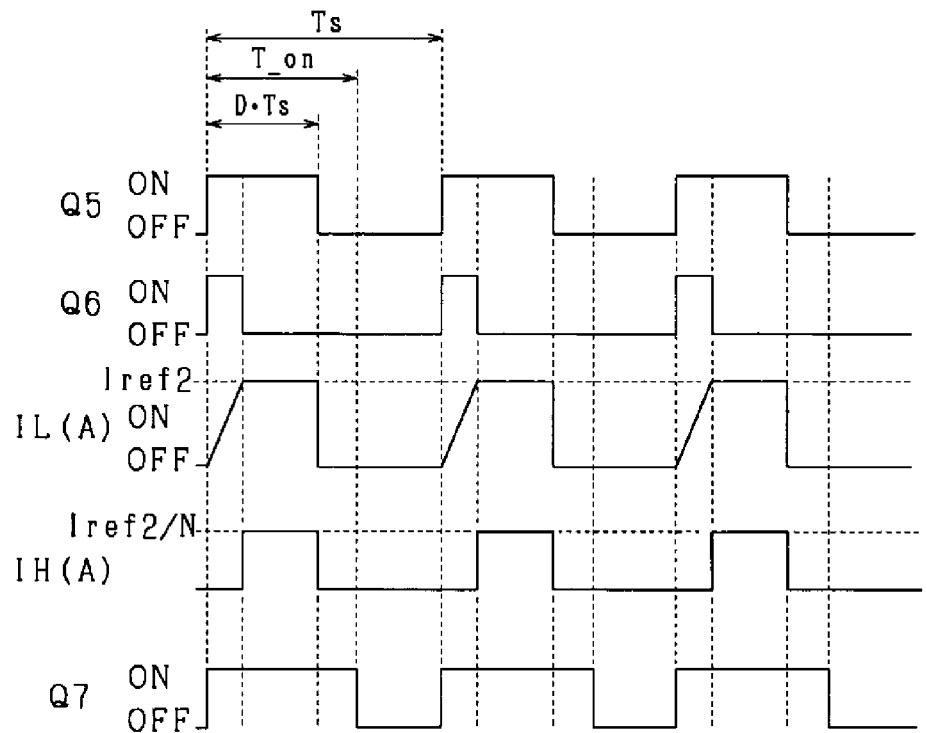
FIG. 9 is a time chart in the case in which second mode control is performed when electrical power is supplied from the second circuit to the first circuit.
Figure 10:
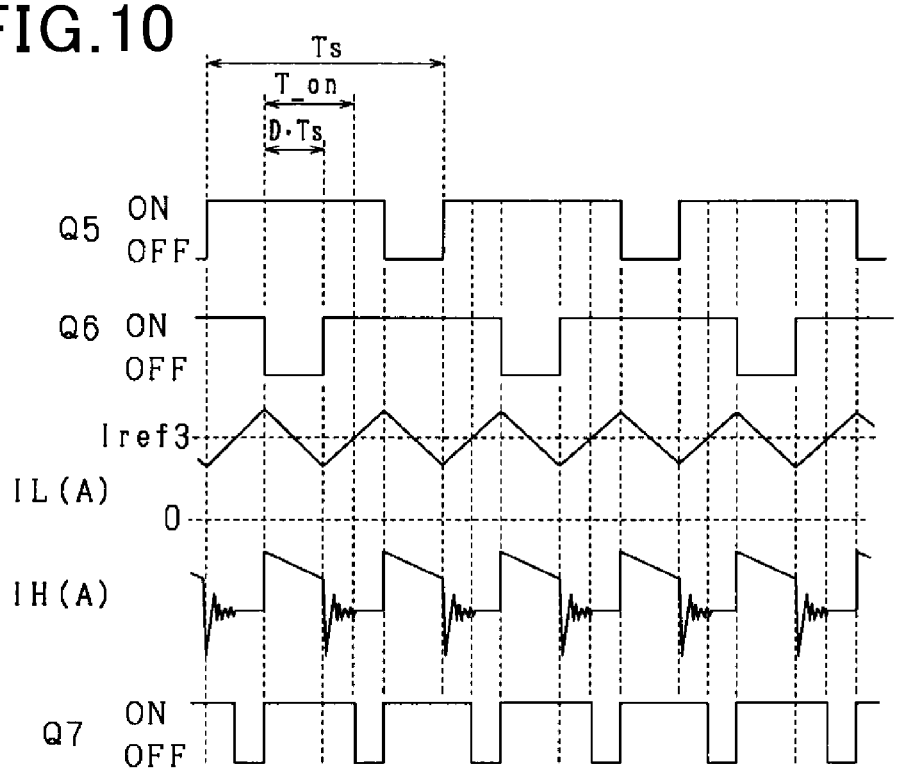
FIG. 10 is a time chart in the case in which third mode control is performed when electrical power is supplied from the second circuit to the first circuit.

Next, the case in which the switching elements Q5 and Q6 of the second circuit 200 are controlled so that electrical power is supplied from the second circuit 200 to the first circuit 100 will be described with reference to FIGS. 8 to 10.

In the case in which electrical power is supplied from the second circuit 200 to the first circuit 100, the control is changed in accordance with the value of the first voltage VH. Specifically, the control is changed in the order starting from a first mode, then to a second mode, and to a third mode as the first voltage VH increases.

First, first mode control will be described with reference to FIG. 8. In the first mode, the fifth switching element Q5 is repeatedly in an on state and an off state in an alternate manner, and the sixth switching element Q6 is continuously in an off state. As a result, a time period during which the fifth switching element Q5 is in an on state and the sixth switching element Q6 is in an off state and a time period during which the fifth switching element Q5 and the sixth switching element Q6 are both in off states are alternately provided.

In this case, electrical power is supplied from the second circuit 200 to the first circuit 100 in the time period during which the fifth switching element Q5 is an on state and the sixth switching element Q6 is in an off state. That is, current flows through the current detection parts 110a and 110b. In contrast, no electrical power is supplied from the second circuit 200 to the first circuit 100 and no current flows through the current detection parts 110a and 110b in the time period during which the fifth switching element Q5 and the sixth switching element Q6 are both in off states. That is, electricity is intermittently applied to the current detection parts 110a and 110b.

Thus, the switching element Q7 in the current detection unit 110 may be turned on in synchronization with the fifth switching element Q5, and then turned off after the fifth switching element Q5 is turned off. Alternatively, in the case in which the upper limit value Dmax (<1) is predetermined for the duty cycle D indicating a time period during which the fifth switching element Q5 is in an on state, the on time period T_on of the switching element Q7 may be set to be longer than "Dmax·Ts" and shorter than Ts.

Next, second mode control will be described with reference to FIG. 9. In the second mode, the fifth switching element Q5 and the sixth switching element Q6 are turned on in synchronization, the sixth switching element Q6 is turned off before the fifth switching element Q5 is turned off, and the fifth switching element Q5 is subsequently turned off, in one control period Ts. As a result, a time period during which the fifth switching element Q5 and the sixth switching element Q6 are both in on states, a time period during which the fifth switching element Q5 is in an on state and the sixth switching element Q6 is an off state, and a time period during which the fifth switching element Q5 and the sixth switching element Q6 are both in off states are provided in this order.

In this case, electrical power is supplied from the second circuit 200 to the first circuit 100 in the time period during which the fifth switching element Q5 is in an on state and the sixth switching element Q6 is in an off state. That is, current flows through the current detection parts 110a and 110b. In contrast, no power is supplied from the second circuit 200 to the first circuit 100 and no current flows through the current detection parts 110a and 110b in the time period during which the fifth switching element Q5 and the sixth switching element Q6 are both in off states. That is, the current detection parts 110a and 110b are applied with electricity intermittently.

Thus, the switching element Q7 of the current detection unit 110 may be turned on in synchronization with the fifth switching element Q5 and the sixth switching element Q6, and then turned off after the fifth switching element Q5 is turned off. Alternatively, in the case in which the upper limit value Dmax (<1) is predetermined for the duty cycle D indicating a time period during which the fifth switching element Q5 is in an on state, the on time period T_on of the switching element Q7 may be set to be longer than "Dmax·Ts" and shorter than Ts.

Lastly, third mode control will be described with reference to FIG. 10. In the third mode, the control period of the fifth switching element Q5 and the control period of the sixth switching element Q6 are shifted by half thereof from each other, and the on time period of each of the fifth switching element Q5 and the sixth switching element Q6 is set to be longer than a half thereof. As a result, a time period during which the fifth switching element Q5 and the sixth switching element Q6 are both in on states and a time period during which one of the fifth switching element Q5 and the sixth switching element Q6 is in an on state are alternately provided.

In this case, electrical power is supplied from the second circuit 200 to the first circuit 100 in the time period during which the fifth switching element Q5 is in an on state and the sixth switching element Q6 is in an off state. That is, current flows through the current detection parts 110a and 110b. In contrast, no power is supplied from the second circuit 200 to the first circuit 100 and no current flows through the current detection parts 110a and 110b in the time period during which the fifth switching element Q5 and the sixth switching element Q6 are both in off states. That is, the current detection parts 110a and 110b are applied with electricity intermittently.

Thus, the switching element Q7 of the current detection unit 110 is turned on in synchronization with the control of turning off one of the fifth switching element Q5 and the sixth switching element Q6, and then is turned off after the switching elements Q5 and Q6 are turned on again and before the other of the switching elements Q5 and Q6 is turned off. In this case, in the case in which the upper limit value Dmax (<1) is predetermined for the duty cycle D indicating a time period during which only one of the fifth switching element Q5 and the sixth switching element Q6 is turned, the on time period T_on of the switching element Q7 may be set to be longer than "Dmax·Ts" and shorter than Ts/2.

With the aforementioned configuration, the current detection unit 110 and the power converter 10 according to the present embodiment provide the following effects.

In the current detection unit 110, when the switching element Q7 is closed, the full-wave rectifier circuit 112 rectifies the current flowing from the second coil 111b, regardless of the direction of the current flowing through the second coil 111b, and thus the current can be output from the output part on the positive electrode side of the full-wave rectifier circuit 112. Hence, in order to enable detection of a current regardless of the direction of the current flowing through the detection part in the electrical circuit, it is only necessary that a single switching element Q7 be provided, and thus the manufacturing cost of the whole current detection unit 110 can be reduced. When this switching element Q7 is opened, magnetic energy stored in the transformer flows to the reset resistor 114 as an excitation current, and thus the magnetic energy stored in the transformer can be consumed.

When current is flowing through an electrical circuit in which a current is to be detected, that is, when the current is flowing from the electrical circuit to the current detection unit 110 via the transformer 111, turning off the switching element Q7 may cause a surge voltage in the current detection unit 110. In the present embodiment, since the switching element Q7 is turned off in a non-electrical conduction time period of the electrical circuit, the surge voltage is prevented from being generated.

Since the on time period T_on of the switching element Q7 is set to be longer than the upper limit of the electrical conduction time period, the switching element Q7 can be turned off in the non-electrical conduction time period of the electrical circuit even when it is difficult to detect the timing of the end of the electrical conduction time period of the electrical circuit. Thus, the surge voltage can be prevented from being generated.

Since an N-type MOSFET lower in cost is used as the switching element Q7, the manufacturing cost of the whole unit can be reduced.

Second Embodiment

As described in the first embodiment, there are cases in which a reset time period in which the reset resistor 114 consumes the current flowing through the current detection unit 110 while the switching element Q7 is in an off state becomes insufficient when electrical power is supplied from the first circuit 100 to the second circuit 200. In this case, the excitation current will be left in the current detection unit 110, and hence the current value IH detected by the current detection unit 110 is smaller than the actual value of the current flowing between the current detection parts 110a and 110b. Specifically, when the current value IH detected by the current detection unit 110 is converted into an output current Io flowing to the second circuit 200 and is controlled so as to reach a command value Io* for the output current Io, the current flowing between the current detection parts 110a and 110b becomes larger than the command value Io*.

Figure 11:
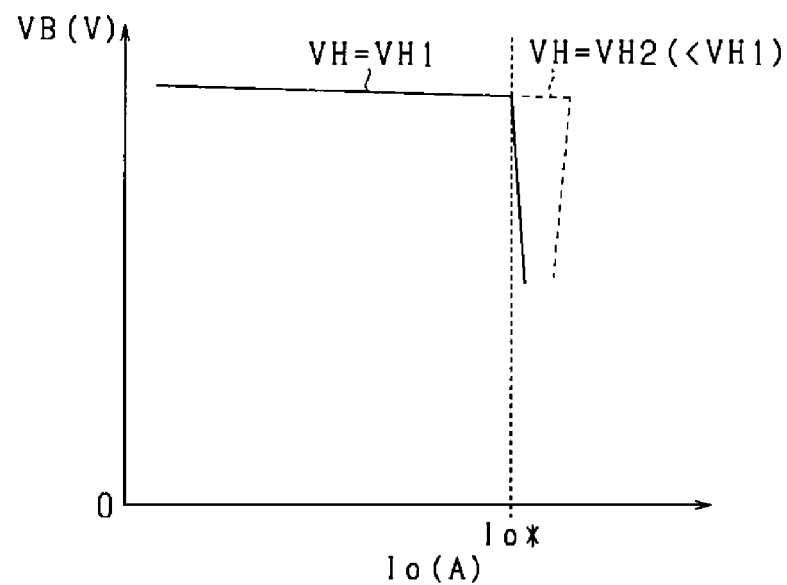
FIG. 11 illustrates a relationship between a current value and a first voltage when a reset period is insufficient.

The relationship between the output current Io and the second voltage VB in the case in which the reset time period becomes insufficient as described above will be described with reference to FIG. 11. As illustrated in FIG. 11, the difference between the detected value of the current and the actual value of the current flowing through the current detection parts 110a and 110b increases as the second voltage VB decreases. This is because the current and the duty cycle D are values inversely proportional to the first voltage VH and proportional to the second voltage VB and thus, the electrical conduction time period lengthens as the first voltage VH decreases whereas the electrical conduction time period lengthens as the second voltage VB increases. That is, this is because the reset time period is more likely to become insufficient as the first voltage VH decreases, and the reset time period is more likely to become insufficient as the second voltage VB increases.

Figure 12:
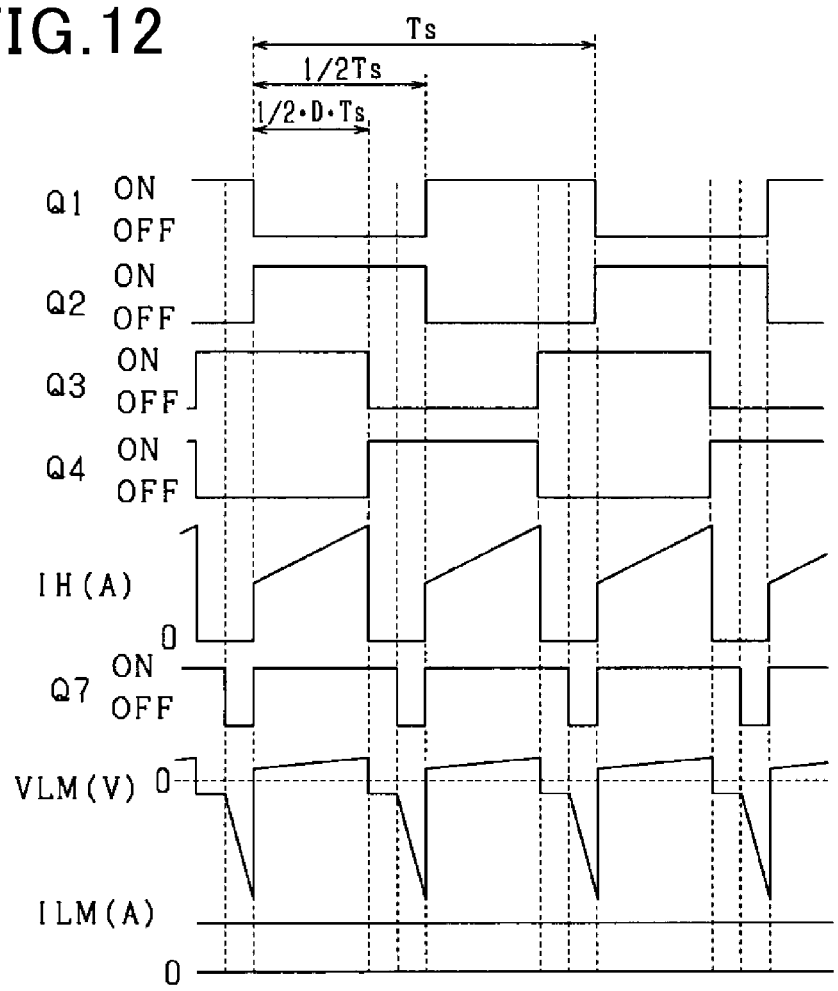
FIG. 12 illustrates an excitation voltage and an excitation current when electrical power is supplied from the first circuit to the second circuit.
Figure 13:
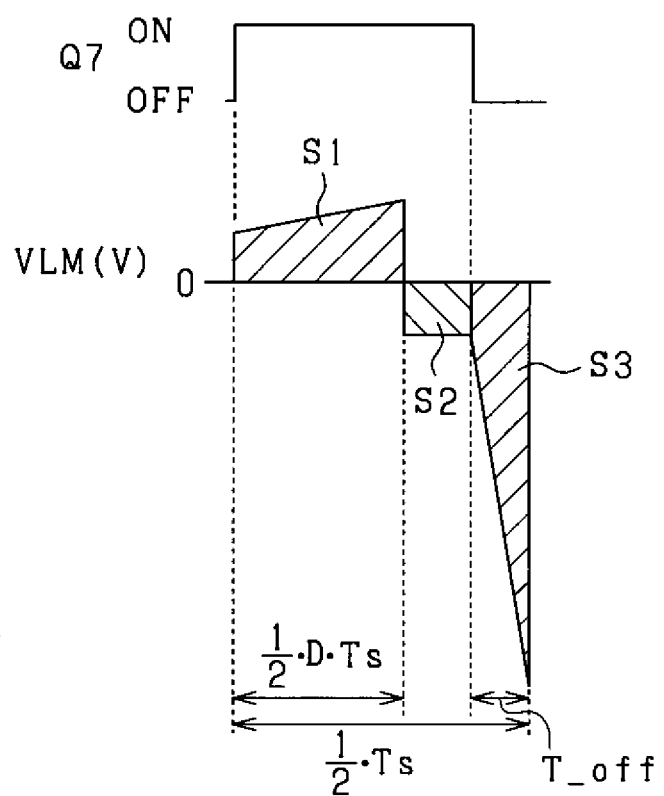
FIG. 13 illustrates computation for determining a correction amount for a command value.

Thus, the present embodiment performs correction in which an offset amount for the output current Io is taken into consideration in the control of setting the output current Io to the command value Io*. An excitation voltage VLM and an excitation current ILM which are used in the correction will be described with reference to FIG. 12 as well as FIG. 13 showing the excitation voltage VLM in an enlarged view. The excitation voltage VLM is generated at the second coil 111b of the current detection unit 110, and the excitation current ILM indicates the offset amount of the current. The excitation voltage VM increases in the time period during which the current detection parts 110a and 110b are applied with electricity, has a negative value in accordance with the value of the excitation current ILM in the time period during which the switching element Q7 is in an on state and the current detection parts 110a and 110b are not applied with electricity, and has a negative value whose absolute value increases in the time period during which the switching element Q7 is in an off state.

In the time period of electrical conduction between the current detection parts 110a and 110b, assuming that the excitation current ILM is constant in a steady state, S1 indicating the voltage-time product of the transformer 111 of the current detection unit 110 can be represented by the following expression (1), where Io* is a command value, N is a turn ratio, Nct is a turn ratio, Ts is one control period, D is a duty cycle, R is a resistance value of the terminating resistor 113, R_mos is a resistance value of the switching element Q7, R_tra is a resistance value of the transformer 111, and VF is the offset amount of voltage.

[Expression 1]

$$S1\left\{\left(\frac{Io^*}{Nct \cdot N} - ILM\right) \cdot (R + R\_mos + R\_tra) + 2VF\right\} \cdot \frac{D \cdot Ts}{2} \quad (1)$$

When the current detection parts 110a and 110b are not applied with electricity and the switching element Q7 is in an on state, S2 indicating a voltage-time product is a value resulting from time integration of the value obtained by multiplying the excitation current ILM by each resistance value in the circuit. That is, S2 can be represented by the following expression (2) using the off time period T_off (<Ts/2) of the switching element Q7.

[Expression 2]

$$S2 = \{ILM \cdot (R + R\_mos + R\_tra) + 2 \cdot VF\} \cdot \left(\frac{Ts}{2} - \frac{D \cdot Ts}{2} - T\_off\right) \quad (2)$$

Furthermore, negative voltage is applied in the time period in which the switching element Q7 is in an off state. Assuming that the resistance value of the reset resistor 114 is sufficiently large with respect to the resistance value of the transformer 111, the voltage applied to the transformer 111 is inversely proportional to parasitic capacitance C of the transformer 111 and has an absolute value increasing in proportion to the excitation current ILM that is constant. Hence, S3 indicating the voltage-time product can be determined through time integration of the excitation current ILM and can be represented by the following expression (3). Note that the maximum value of the absolute value of the voltage in the determination of S3 is sufficiently large with respect to the absolute value of the voltage in S2, and thus S3 is approximate to that changes from the state in which the voltage is zero.

[Expression 3]

$$S3 = \frac{1}{C} \cdot \int_0^{T\_off} ILM \cdot dt \quad (3)$$
$$= ILM \cdot \frac{T\_off^2}{2 \cdot C}$$

In a steady state in which the excitation current ILM is constant, it is sufficient that S1 be equal to the sum of S2 and S3. In other words, it is sufficient that the following expression (4) be satisfied.

[Expression 4]

$$S1 = S2 + S3 \quad (4)$$

Substituting the expressions (1) to (3) into the expression (4) results in the following expression (5).

[Expression 5]

$$\left\{\left(\frac{Io^*}{Nct \cdot N} - ILM\right) \cdot (R + R\_mos + R\_tra) + 2VF\right\} \cdot \frac{D \cdot Ts}{2} = \quad (5)$$
$$\{ILM \cdot (R + R\_mos + R\_tra) + 2 \cdot VF\} \cdot \left(\frac{Ts}{2} - \frac{D \cdot Ts}{2} - T\_off\right) +$$
$$ILM \cdot \frac{Y\_off^2}{2C}$$

Through the above expression (5), the excitation current ILM indicating the offset amount of the output current Io in the current detection unit 110 is represented by the following expression (6).

[Expression 6]

$$ILM = \frac{\dfrac{Io^*}{Nct \cdot N} \cdot (R + R\_mos + R\_tra) \cdot \dfrac{D \cdot Ts}{2} + 2VF \cdot \left(D \cdot Ts - \dfrac{Ts}{2} + T\_off\right)}{(R + R\_mos + R\_tra) \cdot \left(\dfrac{Ts}{2} - T\_off\right) + \dfrac{T\_off^2}{2 \cdot C}} \quad (6)$$

The duty cycle D at the time when electrical power is supplied from the first circuit 100 to the second circuit 200 is represented by the following expression (7).

[Expression 7]

$$D = \frac{\mu \cdot VB}{N \cdot VH} \quad (7)$$

Since it can be assumed that, in the steady state, the command value Io*, the first voltage VH, and the second voltage VB change and the numerical values other than these are constant, substituting the above expression (7) into the above expression (6) and using constants a, b, and c obtain the following expression (8).

[Expression 8]

$$ILM = a \cdot Io^* \cdot \frac{VB}{VH} + b \cdot \frac{VB}{VH} + c \quad (8)$$

The excitation current ILM determined as described above is an offset of the current value in the current detection unit 110, and thus a value obtained by multiplying the excitation current ILM by the turn ratio Nct may be added to the command value Io* as the correction amount.

Figure 14:
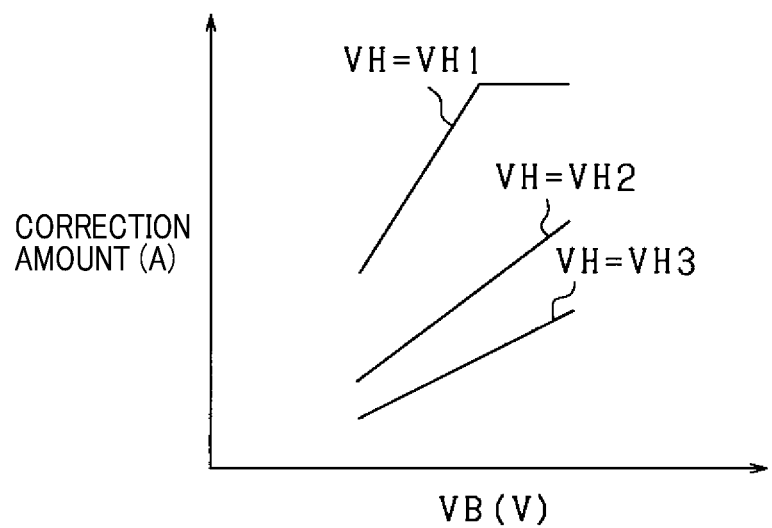
FIG. 14 illustrates relationships between a correction amount for a command value for a current value and the first and second voltages.

The correction amount in the case in which the command value Io* is set to be constant and the first voltage VH and the second voltage VB change will be described with reference to FIG. 14. FIG. 14 illustrates relationships between the second voltage VB and the correction amount for the command value Io* when the first voltage VH is VH1, VH2, or VH3, where VH1<VH2<VH3. As illustrated in FIG. 14, the correction amount increases as the first voltage VH decreases, and the correction amount increases as the second voltage VB increases. Note that the correction amount has a predetermined upper limit, and FIG. 14 illustrates that, in the case in which the first voltage VH is VH1, the correction amount reaches the upper limit value when the second voltage VB is more than a predetermined value.

Figure 15:
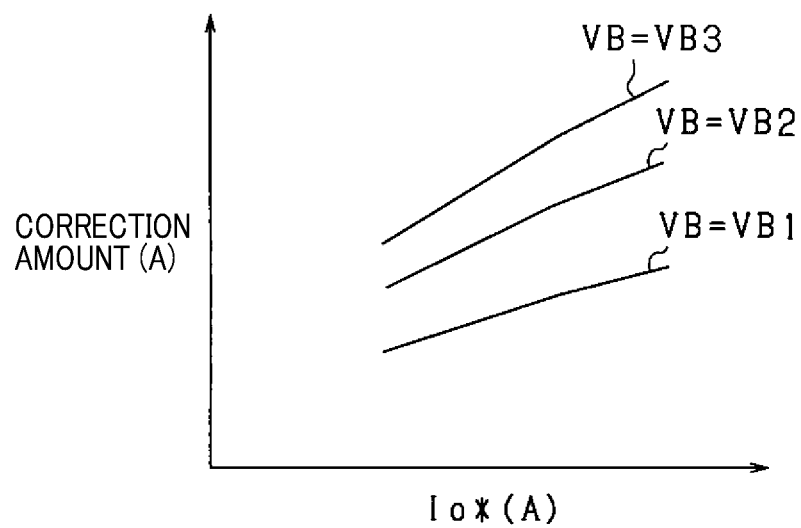
FIG. 15 illustrates relationships between a correction amount for a command value for a current value, and a second voltage and a command value.

FIG. 15 illustrates relationships between the command value Io* and the correction amount for the command value Io* in the case in which the first voltage VH is set to be constant and the second voltage VB is VB1, VB2, or VB3, where VB1<VB2<VB3. As illustrated in FIG. 15, the correction amount increases as the second voltage VB increases, and the correction amount increases as the command value Io* increases.

Figure 16:
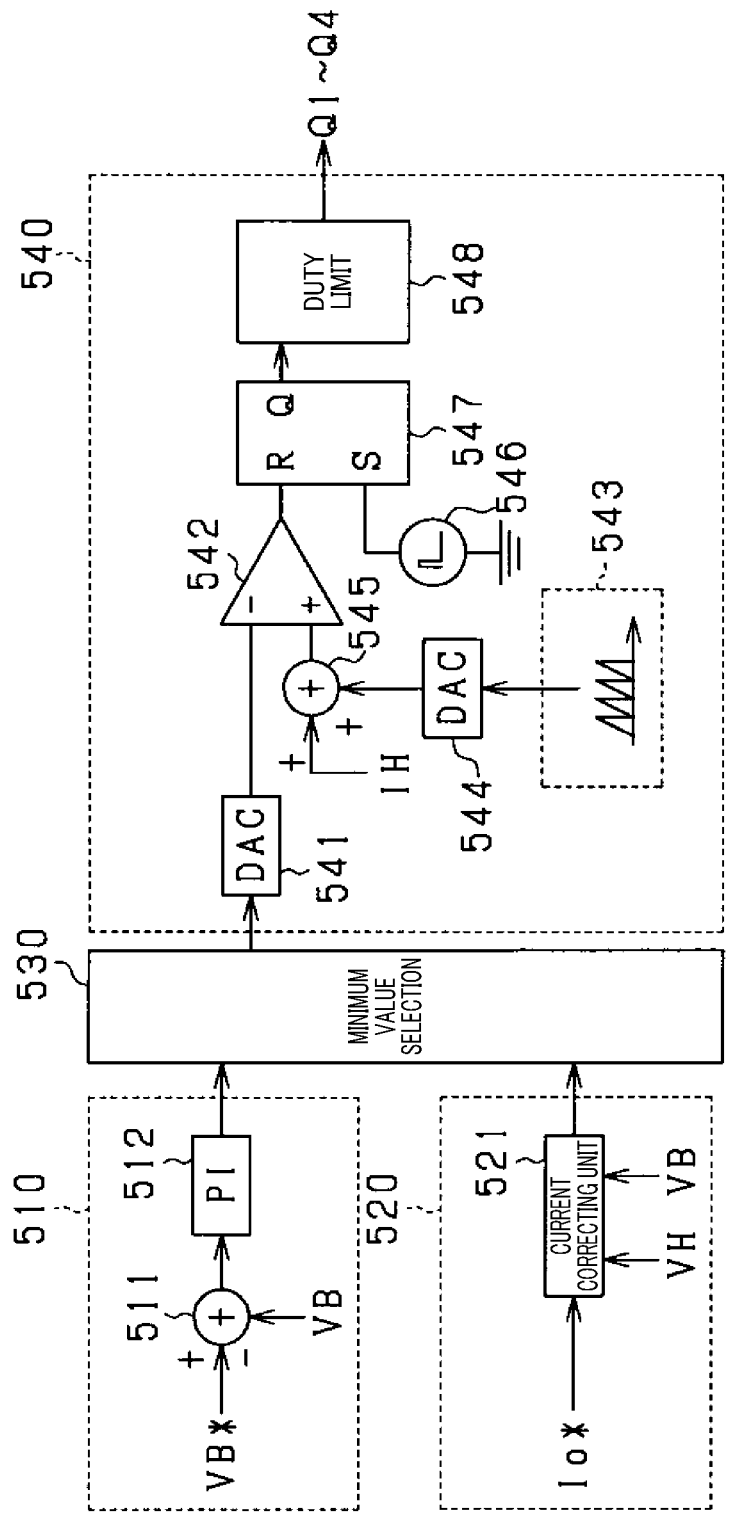
FIG. 16 is a control block diagram illustrating the case in which electrical power is supplied from the first circuit to the second circuit.

Next, the control performed when electrical power is supplied from the first circuit 100 to the second circuit 200 will be described with reference to FIG. 16.

When electrical power is supplied from the first circuit 100 to the second circuit 200, the control is performed using a smaller one of the command value for the current value IH in the constant voltage control and the command value for the current value IH in the constant current control. A constant voltage control unit 510 obtains a command value VB* for the second voltage VB and inputs the command value VB* to an adder 511. The command value VB* may be stored in a memory included in the control unit 300 or may be obtained from a higher-order electronic control unit (ECU) or the like. The second voltage VB detected by a voltage detection unit 210 is also input to the adder 511, and the difference between the command values VB* and the second voltage VB is calculated. The difference between the command value VB* and the second voltage VB is input to a PI controller 512, and the command value, which is an output value of the PI controller 512, is input to a minimum value selecting unit 530.

A constant current control unit 520 obtains the command value Io*, the first voltage VH, and the second voltage VB, and inputs them to a current correcting unit 521. The command value Io* may be stored in the memory included in the control unit 300 or may be obtained from the higher-order ECU or the like. The current correcting unit 521 calculates a correction value for the command value Io* by computation using the above expression (8) and adds the correction value to the command value Io*. Subsequently, the value obtained by adding the correction value to the command value Io* is converted into a command value for the current value IH. Specifically, the value obtained by adding the correction value to the command value Io* is divided by the turn ratio N of the transformer Tr11 between the first circuit 100 and the second circuit 200. The resulting command value for the current value IH is then input to the minimum value selecting unit 530.

The minimum value selecting unit 530 outputs, to a peak current control unit 540, a smaller one of the command value obtained from the constant voltage control unit 510 and the command value obtained from the constant current control unit 520. In the peak current control unit 540, the command value is converted into an analog value by a DA converter 541, and the analog value is input to the negative terminal of a comparator 542.

Meanwhile, a slope compensating unit 543 of the peak current control unit 540 generates, as a signal, a value of a slope current obtained from a value of a register, and inputs the signal to a DA converter 544. The slope current is a sawtooth signal which monotonically increases in a linear fashion from 0 A in each control period, as described above. The slope current converted by the DA converter 544 into an analog waveform and the current value IH detected by the current detection unit 110 are added by an adder 545 and then input to the negative terminal of the comparator 542. Note that the slope compensating unit 543 may generate a signal of an analog waveform and input the signal to the comparator 542 directly, i.e., not via the DA converter 544.

The comparator 542 compares the command value input to the negative terminal with the value obtained by adding the slope current to the current value IH and then input to the positive terminal. A high-level signal is input to the R terminal of an RS flip-flop 547 in a time period during which the input value at the positive terminal is less than the input value at the negative terminal, and a low-level signal is input to the R terminal of the RS flip-flop 547 in a time period during which the input value of the positive terminal is more than the input value of the negative terminal. Furthermore, a clock signal is input from a clock 546 to the S terminal of the RS flip-flop 547.

The output of the RS flip-flop 547 is output to the first to fourth switching elements Q1 to Q4 after an upper limit value and a lower limit value of a duty value are set by a duty limit unit 548.

Figure 17:
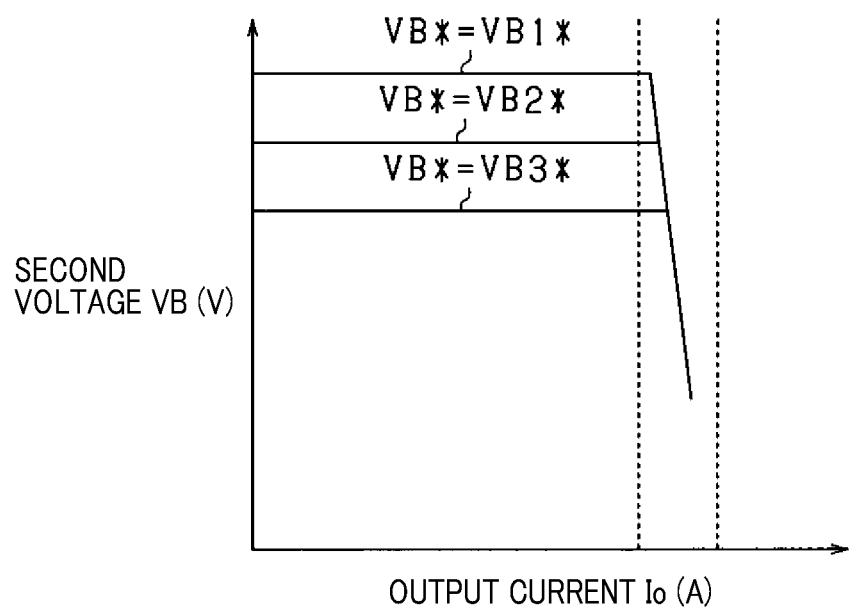
FIG. 17 is a diagram illustrating effects of a second embodiment.

The effects provided by the power converter 10 controlled as described above will be described with reference to FIG. 17. FIG. 17 illustrates relationships between the second voltage VB and the output current Io in the case in which VB1*, VB2*, or VB3* (VB1*>VB2*>VB3*) is selected as the command value VB* for the second voltage VB in the constant voltage control unit 510. As shown in FIG. 16, the output current Io is controlled based on a smaller command value between the command value determined by the constant voltage control unit 510 and the command value determined by the constant current control unit 520. Hence, when the output current Io is less than a predetermined value, the command value in the constant voltage control becomes smaller and the constant voltage control is performed. When the output current Io is more than the predetermined value, the command value in the constant current control becomes smaller and the constant current control is performed. In this case, as described above, the command value Io* in the constant current control is corrected, and hence the output current Io can be equally controlled regardless of the command value VB* for the second voltage VB.

Figure 18:
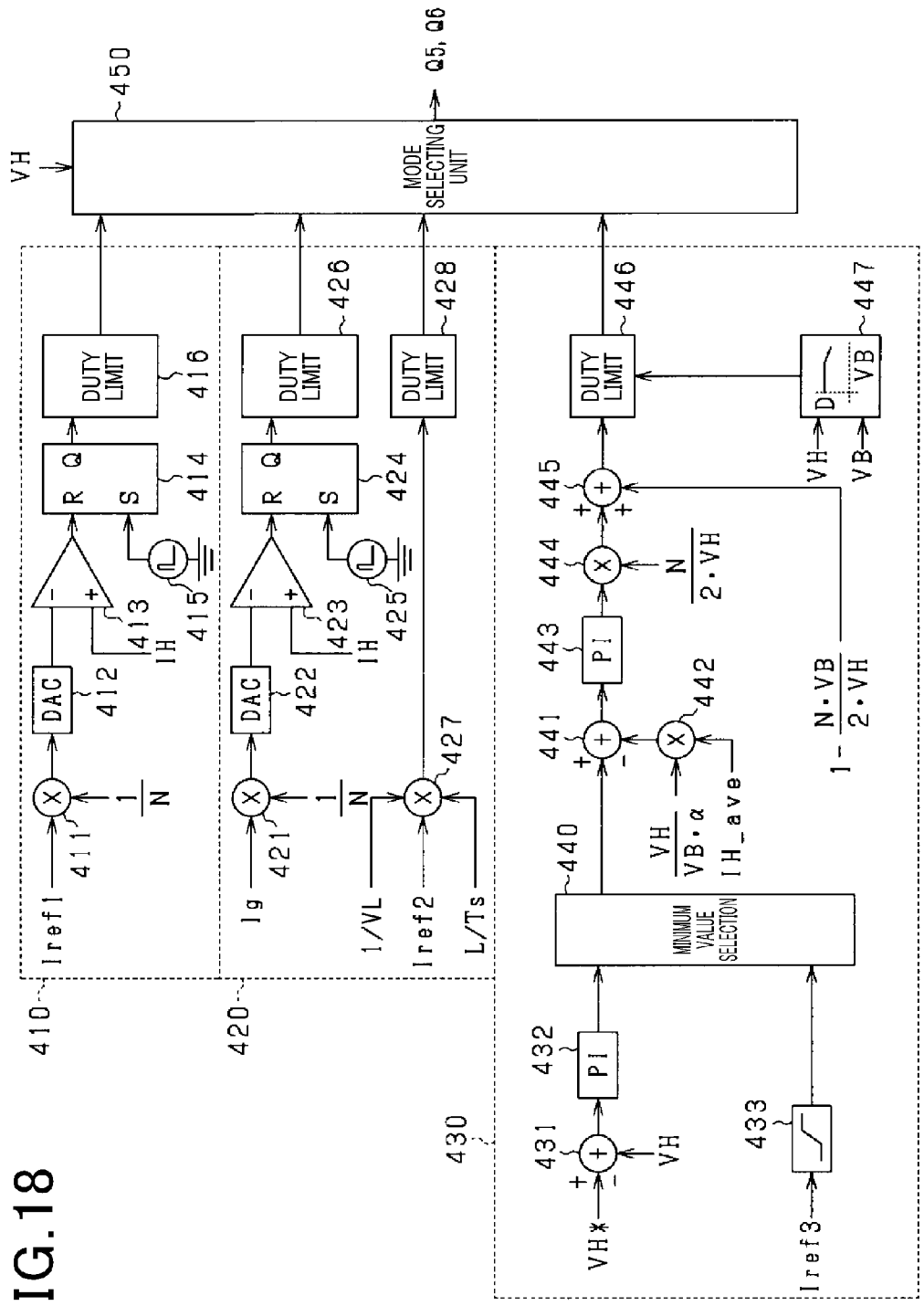
FIG. 18 is a control block diagram illustrating the case in which electrical power is supplied from the second circuit to the first circuit.

Next, the control performed when electrical power is supplied from the second circuit 200 to the first circuit 100 will be described with reference to FIG. 18.

First, a first mode setting unit 410 will be described. First, a first command value Iref1, which is a command value for current flowing in the second circuit 200, is input to a multiplier 411 and multiplied by the reciprocal of the turn ratio N. That is, the command value for the current flowing in the second circuit 200 is converted into a command value for the current value IH. The value obtained from the multiplier 411 is input to the negative terminal of a comparator 413 via a DA converter 412. Meanwhile, the current value IH is input to the positive terminal of the comparator 413.

The comparator 413 compares the current value IH input to the positive terminal and the value obtained by converting the first command value Iref1 into the command value for the current value IH and then input to the negative terminal. A low-level signal is input to the R terminal of an RS flip-flop 414 in a time period during which the input value of the positive terminal is more than the input value at the negative terminal. Furthermore, a clock signal is input from a clock 415 to the S terminal of the RS flip-flop 414.

In the first mode, the input of the low-level signal means that the current value IH has exceeded the value obtained by dividing the first command value Iref1 by the turn ratio N. Hence, the RS flip-flop 414 transmits a signal for turning off both the fifth switching element Q5 and the sixth switching element Q6. Subsequently, when one control period has passed, a signal for turning on one of the fifth switching element Q5 and the sixth switching element Q6 and turning off the other is transmitted.

The output signal of the RS flip-flop 414 is input to a duty limit unit 416. In the duty limit unit 416, when the duty value of the fifth switching element Q5 and the sixth switching element Q6 is more than an upper limit value D_max, the duty value is set to the upper limit value D_max. The upper limit value D_max is set to a value of less than 50%, for example, to 45%. The control signal for the fifth switching element Q5 and the sixth switching element Q6 determined as described above is input to a mode selecting unit 450.

Next, a second mode setting unit 420 will be described. In the second mode setting unit 420, an on/off state of the fifth switching element Q5 and an on/off state of the sixth switching element Q6 are determined by individual computation.

In the control of the fifth switching element Q5, an upper limit value Ig of the current flowing in the second circuit 200 is input to a multiplier 421 and multiplied by the reciprocal of the turn ratio N. The upper limit value Ig indicates the upper limit of the current in the second mode. That is, the upper limit of the current flowing in the second circuit 200 is converted into an upper limit of the current value IH. The value obtained from the multiplier 421 is input to the negative terminal of a comparator 423 via a DA converter 422. Meanwhile, the current value IH is input to the positive terminal of the comparator 423.

The comparator 423 compares the current value IH input to the positive terminal and the value obtained by converting the upper limit value Ig into the upper limit of the current value IH and then input to the negative terminal. A low-level signal is input to the R terminal of an RS flip-flop 424 in a time period during which the input value of the positive terminal is more than the input value of the negative terminal. Furthermore, a clock signal is input from a clock 425 to the S terminal of the RS flip-flop 424.

The input of the low-level signal means that the current value IH has exceeded the value obtained by dividing the upper limit value Ig by the turn ratio N. Hence, the RS flip-flop 424 transmits a signal for turning off the fifth switching element Q5. The output signal of the RS flip-flop 424 is input to a duty limit unit 426. In the duty limit unit 426, when the duty value of the fifth switching element Q5 is more than an upper limit value Dmax, the duty value is set to the upper limit value Dmax. The upper limit value Dmax is set to, for example, 50%. The control signal for the fifth switching element Q5 determined as described above is input to the mode selecting unit 450.

In the control of the sixth switching element Q6, a second command value Iref2, which is a command value for current flowing to the second circuit 200, is input to a multiplier 427. The reciprocal of a reactor voltage VL and a value obtained by dividing self-inductance L of a choke coil L13 by one control period Ts are also input to this multiplier 427. The output value of this multiplier 427 is input to a duty limit unit 428. In the duty limit unit 428, when the duty value of the sixth switching element Q6 is more than the upper limit value, the duty value is set to the upper limit value that is less than 50%. The limit value is set to, for example, 45%. The control signal for the sixth switching element Q6 determined as described above is input to the mode selecting unit 450.

Next, a third mode setting unit 430 will be described. In the third mode setting unit 430, first, a command value for an average value of current flowing to the second circuit 200 is determined. Specifically, a command value to be used in the constant voltage control and a command value to be used in the constant current control are determined, and then control is performed using the smallest command value among the determined command values.

In order to determine the command value for the constant voltage control, a target value VH* of the first voltage VH and the detected first voltage VH are input to an adder 431, and the difference therebetween is input to a PI controller 432. The output value of the PI controller 432 is a command value to be used in the constant voltage control and is input to a minimum value selecting unit 440.

Meanwhile, the control unit 300 obtains a command value Iref3 for current in the second circuit 200 from the higher-order ECU through communication over the controller area network (CAN) or the like. The command value Iref3 is input to a gradually-changing unit 433. The gradually-changing unit 433 outputs a gradually increasing value based on the input command value Iref3. The output value of the gradually-changing unit 433 is input to the minimum value selecting unit 440.

When the command values are input to the minimum value selecting unit 440 as described above, the minimum value selecting unit 440 outputs, as a command value, the smallest value among the input command values. The command value output from the minimum value selecting unit 440 is input to an adder 441. A value obtained by converting an average value IH_ave of the current values IH into a value of the current flowing in the second circuit 200 is also input to the adder 441. Specifically, the average value IH_ave of the current values IH and the value obtained by dividing the first voltage VH by the second voltage VB are input to a multiplier 442. In the multiplication by this multiplier 442, conversion efficiency a of the power converter 10 may be taken into consideration. The output value of the multiplier 442 is input to the adder 441. The difference between the input values is calculated in the adder 441 and is input to a PI controller 443.

The output value of the PI controller 443 is input to a multiplier 444 and is multiplied by a value obtained by dividing the turn ratio N by a value twice the first voltage VH. The output value of the multiplier 444 is input to an adder 445. A duty value for feed-forward control is input to the adder 445.

The output value of the adder 445 is input to a duty limit unit 446. The upper limit value D_max of the duty value determined by an upper limit value setting unit 447 is also input to the duty limit unit 446. The upper limit value D_max of the duty value is determined in accordance with the first voltage VH and the second voltage VB. When the calculated duty value is more than the upper limit value D_max, the duty limit unit 446 outputs the upper limit value D_max. The output value of the duty limit unit 446 is input to the mode selecting unit 450.

The first voltage VH is also input to the mode selecting unit 450, and selection is made from among the first to third modes. Subsequently, the fifth switching element Q5 and the sixth switching element Q6 are controlled in the selected mode.

With the aforementioned configuration, the power converter 10 according to the present embodiment provides the following effects.

In the control of the first circuit 100 to convert the current value IH, which is a value detected by the current detection unit 110, into the output current Io, and set the output current Io to the predetermined command value Io*, there are cases in which a sufficient reset time period cannot be secured and the excitation current ILM is left in the current detection unit 110 at the end of the reset time period. In this case, the value detected by the current detection unit 110 is a value obtained by adding the excitation current ILM to a value corresponding to the current flowing through the current detection parts 110a and 110b. That is, the detected value smaller than the actual value of the current flowing through the current detection parts 110a and 110b is obtained. Hence, when the first circuit 100 is controlled to set the output current Io to the command value Io*, the current flowing through the detection part becomes more than the command value Io*, and thus a longer time is required to supply electrical power from the first circuit 100 to the second circuit 200. In this regard, in the present embodiment, the command value Io* is corrected based on the first voltage VH and the second voltage VB, thereby allowing the command value Io* to reflect an offset of the excitation current ILM in the current detection unit 110. Thus, the actual current flowing through the detection part can be adjusted to approach the command value Io*.

Modifications

Figure 19:
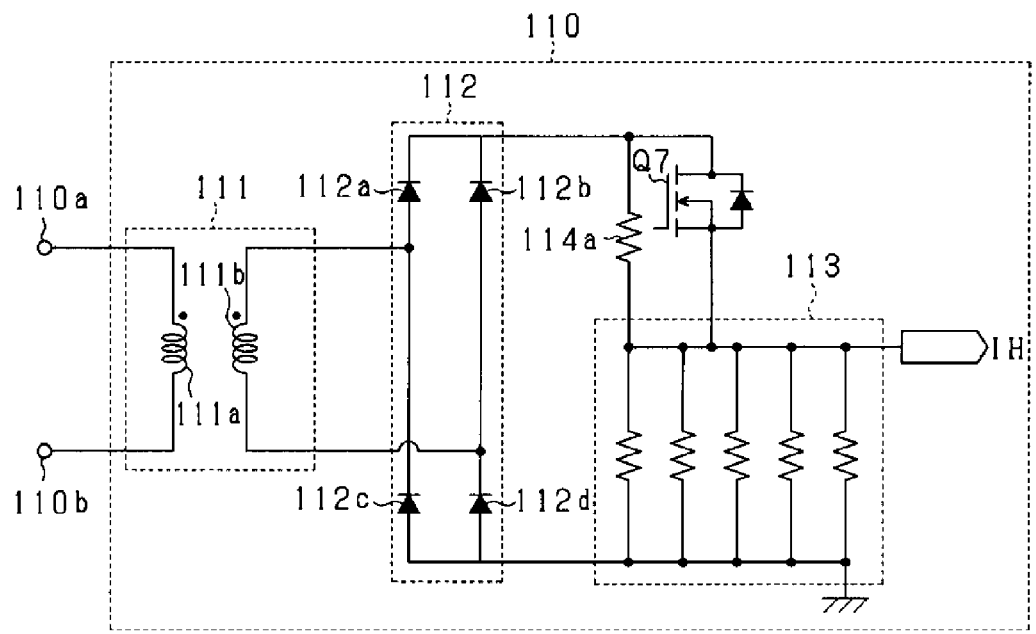
FIG. 19 illustrates another exemplary current detection apparatus.
Figure 20:
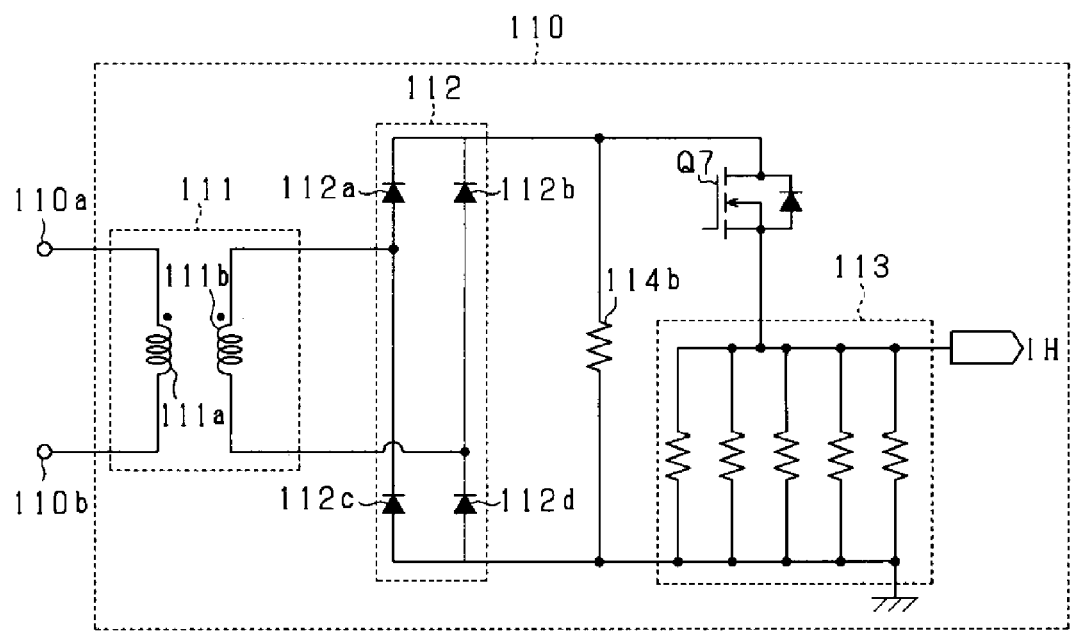
FIG. 20 illustrates another exemplary current detection apparatus.
Figure 21:
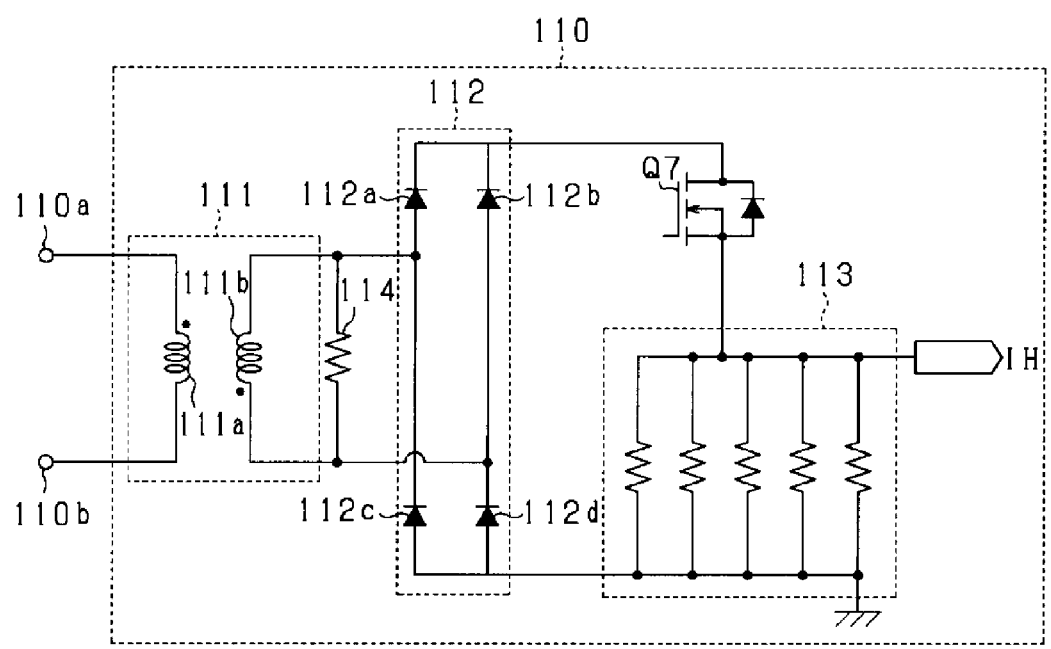
FIG. 21 illustrates another exemplary current detection apparatus.

The circuit configuration of the current detection unit 110 is not limited to that described in the first embodiment and can be modified. Specifically, as shown in FIG. 19, a reset resistor 114a may be connected in parallel with the switching element Q7. Alternatively, as shown in FIG. 20, a reset resistor 114b may be connected in parallel with a serial connection including the switching element Q7 and the terminating resistor 113. Even in these cases, when the switching element Q7 is turned off, a closed circuit including the reset resistor 114a or 114b and the second coil 111b is maintained. Furthermore, as shown in FIG. 21, the direction of turns of the second coil 111b may be reversed. Even in this case, the full-wave rectifier circuit 112 can rectify the current flowing in either direction between the current detection parts 110a and 110b, and thus the current value IH can be detected.

In the embodiments, the power converter 10 includes the first circuit 100, which is a voltage conversion circuit, and the second circuit 200, which is a current conversion circuit. The configurations of the first circuit 100 and the second circuit 200 are not limited to those described in the embodiments. That is, the first circuit 100 and the second circuit 200 may be anything that is capable of bidirectional power exchange therebetween.

Although the second embodiment uses the command value Io* for the output current Io in the control, the command value IH* for the current value IH may be used in the control. In this case, the command value IH* may be used instead of the value Io*/N in the above expressions (3), (5), and (6). Note that in the above expression (8), 1/N may be included in the constant a, and the command value IH* may be used instead of the command value Io*.

Although the second embodiment corrects the command value Io* for the output current Io by adding a correction value thereto, the current value IH detected by the current detection unit 110 may be corrected, or the output current Io converted from the current value IH may be corrected. Specifically, a value obtained by multiplying, by the turn ratio N, the correction value obtained by the above expression (8) may be subtracted from the current value IH, or the correction value obtained by the above expression (8) may be subtracted from the output current Io. In this case, the correction value may be subtracted from the current value IH before the current value IH is input to the comparator 542, for example, in the peak current control unit 540 in the control block diagram shown in FIG. 16. Doing so will also provide effects similar to those of the second embodiment.

In the second embodiment, since the command value Io* for the output current Io changes, the correction amount for the command value Io* is determined by the above expression (8). In this regard, the command value Io* for the output current Io may be set to be constant. In this case, the command value Io* can be handled as a constant, and thus the excitation current ILM can be represented by the following expression (9) using the constants a and b.

[Expression 9]

$$ILM = a \cdot \frac{VB}{VH} + b \qquad (9)$$

Although the embodiments use the N-type MOSFETs as the switching elements Q1 to Q7, P-type MOSFETs or other elements may be used instead.

It will be appreciated that the present invention is not limited to the configurations described above, but any and all modifications, variations or equivalents, which may occur to those who are skilled in the art, should be considered to fall within the scope of the present invention.

Hereinafter, aspects of the above-described embodiments will be summarized.

As an aspect of the embodiment, a current detection apparatus (110) is provided which detects a current flowing through a detection part (110a, 110b) in an electrical circuit. The current detection apparatus includes: a first coil (111a) connected in series with the detection part; a second coil (111b) magnetically coupled with the first coil; a full-wave rectifier circuit (112) connected to both ends of the second coil; a switching element (Q7) having a first end connected to a positive electrode side output part of the full-wave rectifier circuit and a second end connected to a first resistor (113); and a second resistor (114) that forms a closed circuit with the second coil regardless of an open or closed state of the switching element.

With the aforementioned configuration, when the switching element is closed, the full-wave rectifier circuit rectifies a current flowing from the second coil, regardless of the direction of the current flowing through the second coil, and thus the current can be output from the positive electrode side output part of the full-wave rectifier circuit. Hence, in order to enable detection of a current regardless of the direction of the current flowing through the detection part in the electrical circuit, it is only necessary that a single switching element be provided, and thus the manufacturing cost of the whole current detection apparatus can be reduced. When the switching element is opened, magnetic energy stored in a transformer flows to the second resistor as an excitation current, and thus the magnetic energy stored in the transformer can be consumed.

What is claimed is:

1. A current detection apparatus which detects a current flowing through a detection part in an electrical circuit, the current detection apparatus comprising:
   a first coil connected in series with the detection part;
   a second coil magnetically coupled with the first coil;
   a full-wave rectifier circuit connected to both ends of the second coil;
   a switching element having a first end connected to a positive electrode side output part of the full-wave rectifier circuit and a second end connected to a first resistor; and
   a second resistor that forms a closed circuit with the second coil regardless of an open or closed state of the switching element.

2. The current detection apparatus according to claim 1, wherein
   the detection part in the electrical circuit is applied with electricity intermittently, and
   an on time period of the switching element includes an electrical conduction time period during which the detection part is applied with electricity, and the switching element is turned off in a non-electrical conduction time period during which the detection part is not applied with electricity.

3. The current detection apparatus according to claim 2, wherein
   the electrical conduction time period during which the detection part is applied with electricity has an upper limit, and
   the on time period of the switching element is set to be longer than the upper limit of the electrical conduction time period.

4. The current detection apparatus according to claim 1, wherein the switching element is an N-type MOSFET.

5. A power conversion apparatus comprising:
   a first circuit and a second circuit connected via a transformer;
   the current detection apparatus according to claim 1; and
   a control unit that controls at least one of the first circuit and the second circuit to set a current value of a current detected by the current detection apparatus or a current flowing through the second circuit to a predetermined command value, wherein
   the first circuit includes: a switching element group including a plurality of switching elements; and a capacitor connected in parallel with the switching element group, the first circuit being a voltage power conversion circuit that steps down a voltage in response to control of the control unit controlling the switching element group, and
   the detection part is provided between the switching element group and the capacitor.

6. The power conversion apparatus according to claim 5, wherein
   when electrical power is supplied from the first circuit to the second circuit,
   the control unit corrects one of the command value and the current value based on an input voltage that is a voltage on a side of the transformer where the first circuit is located and an output voltage that is a voltage on a side of the transformer where the second circuit is located.

7. The power conversion apparatus according to claim 6, wherein the control unit adds, to the command value, a value monotonically increasing with respect to the output voltage.

8. The power conversion apparatus according to claim 6, wherein the control unit adds, to the command value, a value monotonically decreasing with respect to the input voltage.

9. The power conversion apparatus according to claim 6, wherein
the control unit adds the following to the command value:

$$a \cdot \frac{VB}{VH} + b$$

where VH is the input voltage, VB is the output voltage, and a and b are constants.

10. The power conversion apparatus according to claim 6, wherein the control unit adds, to the command value, a value monotonically increasing with respect to the command value.

11. The power conversion apparatus according to claim 6, wherein
the control unit adds the following to the command value:

$$a \cdot IH* \cdot \frac{VB}{VH} + b \cdot \frac{VB}{VH} + c$$

where VH is the input voltage, VB is the output voltage, IH* is the command value, and a and b are constants.

* * * * *